United States Patent [19]
McKenney et al.

[11] Patent Number: 6,099,745
[45] Date of Patent: Aug. 8, 2000

[54] RIGID/FLEX PRINTED CIRCUIT BOARD AND MANUFACTURING METHOD THEREFOR

[75] Inventors: Darryl McKenney, Londonderry; Arthur Demaso, Nashua; Craig Wilson, Brookline, all of N.H.

[73] Assignee: Parlex Corporation, Methuen, Mass.

[21] Appl. No.: 09/304,916

[22] Filed: May 4, 1999

Related U.S. Application Data

[60] Provisional application No. 60/088,282, Jun. 5, 1998.

[51] Int. Cl.[7] .................... H05K 1/00; H05K 3/06
[52] U.S. Cl. .................... 216/13; 216/17; 216/20; 216/36; 216/105; 29/846; 205/223; 174/254
[58] Field of Search .................... 216/13, 17, 18, 216/20, 36, 100, 101, 105; 174/254; 29/846; 205/223

[56] References Cited

U.S. PATENT DOCUMENTS

| | | | |
|---|---|---|---|
| 4,715,928 | 12/1987 | Hamby | 156/630 |
| 4,800,461 | 1/1989 | Dixon et al. | 361/398 |
| 4,830,704 | 5/1989 | Voss et al. | 156/629 |
| 4,931,134 | 6/1990 | Hatkevitz et al. | 156/630 |
| 5,004,639 | 4/1991 | Desai | 428/138 |
| 5,095,628 | 3/1992 | McKenney et al. | 29/846 |
| 5,175,047 | 12/1992 | McKenney et al. | 428/209 |
| 5,178,318 | 1/1993 | Edwin et al. | 228/180 |
| 5,262,594 | 11/1993 | Edwin et al. | 174/254 |
| 5,639,389 | 6/1997 | Schmidt et al. | 216/18 |
| 5,802,714 | 9/1998 | Kobayashi et al. | 29/852 |

OTHER PUBLICATIONS

Military Specification MIL–P–13949G "Plastic Sheet, Laminated, Metal Clad (For Printed Wiring Boards)" Feb. 11, 1987.

*Primary Examiner*—Randy Gulakowski
*Assistant Examiner*—Anita Alanko
*Attorney, Agent, or Firm*—Weingarten, Schurgin, Gagnebin & Hayes LLP

[57] ABSTRACT

In a rigid/flex circuit board and fabricating process, patterns of electrical traces are formed by etching conductive layers on outer surfaces of a flexible multi-layer circuit structure. A protective barrier material is deposited on the etched traces using an "electroless" process, such as immersion of the flexible circuit board in an aqueous solution containing ionic tin. The protective barrier material adheres to and encapsulates the copper traces. An outer circuit structure including a bondfilm of epoxy-impregnated fiberglass ("prepreg" bondfilm) and a copper foil layer is laminated onto the flexible circuit structure. The prepreg bondfilm has a window area removed by routing or an equivalent process prior to being laminated to the flexible structure. The window area defines a flex area of the rigid/flex circuit board that will be relatively flexible. The portion of the outer copper foil above the window area of the prepreg bondfilm is then removed using a chemical etchant to which the previously-applied protective barrier material is immune, such as an ammoniacal etching solution. After the copper foil is etched, the protective barrier material in the flex area of the flexible circuit is stripped away. A flexible sealing coating is then applied to the circuit board to cover the edges of the outer laminated circuit structure.

10 Claims, 2 Drawing Sheets

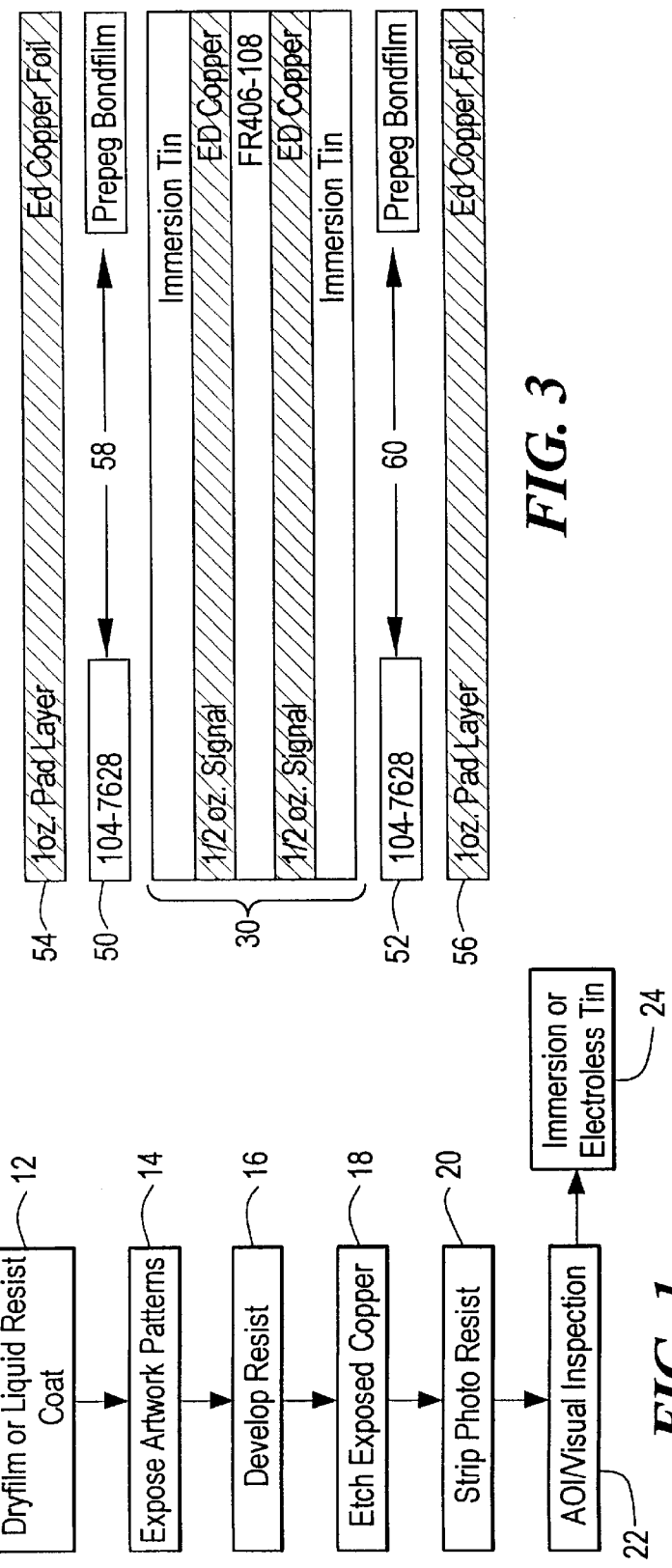
FIG. 1  FIG. 2  FIG. 3

RIGID/FLEX PRINTED CIRCUIT BOARD AND MANUFACTURING METHOD THEREFOR

CROSS REFERENCE TO RELATED APPLICATIONS

This application claims the priority of U.S. Provisional Patent Application No. 60/088,282 filed Jun. 5, 1998 entitled "Rigid/Flex Printed Circuit Board".

BACKGROUND OF THE INVENTION

The present invention is related to the field of printed circuit boards, and in particular to the manufacture of rigid/flex printed circuit boards having both rigid and flexible areas so as to be mountable in non-planar spaces.

Printed circuit board technology has evolved such that it is presently possible to fabricate so-called "rigid/flex" circuit boards that have desirable characteristics of both rigid and flexible circuits. Relatively rigid areas of rigid/flex boards are used for mounting circuit components, attaching external cables via connectors, and providing electrical circuit interconnections among the components and connectors. Relatively flexible areas of the rigid/flex boards are used to carry electrical interconnections and to enable the board to be bent or shaped as required by the physical characteristics of the system in which the board is to be used. For example, it is known to use a rigid/flex having two rigid areas connected by a flex area and folded into a "U" shape to attain higher volumetric component density than might be achieved using two separate rigid circuit boards and conventional interconnection technology.

Rigid/flex circuit boards have a variety of structures, and have been made by a variety of methods. Some rigid/flex circuit boards are fabricated by laminating a series of flexible layers together, alternating insulative and conductive layers as necessary. One technique for forming flexible areas involves the selective removal of portions of outer laminated layers. Where the outer layers have been removed, the board is relatively thin, and thus more flexible than in surrounding areas where the laminated outer layers have not been removed.

One method of fabricating rigid/flex boards employs a flexible insulative core that is copper-cladded on both sides. The copper layers are selectively etched to form circuit traces. Then an insulating layer and another conductive layer are laminated to each side, resulting in a rigid/flex board having four or more conductive layers. Prior to lamination, the outer insulating layers are provided with openings where flexible areas of the rigid/flex circuit board will exist. The openings may be formed for example by routing. The outer conductive layers are formed of thin, conductive, metallic foil such as copper foil. Because of their fragility, it is generally not feasible to etch or shape the outer conductive layers prior to lamination. Rather, the foil is first laminated to the circuit board for mechanical stability, and then portions of the laminated foil are removed by suitable means such as chemical etching.

One potential problem that arises in the above-described process is that the copper traces on the inner layers adjacent to the core are exposed in the areas where openings have been formed in the laminated outer insulating layers. Steps must be taken to protect these exposed traces prior to etching the outer laminated foil, so that the etchant does not attack the exposed metal traces. As a general matter, prior techniques have employed one or more additional process steps to deposit a "mask" of inert material on the flexible circuit prior to the lamination of the pre-processed insulating outer layers. The mask material is deposited or laminated in the areas where the openings in the outer insulating layers are formed. Subsequently, the edges of the mask pattern are sealed in some manner to the surrounding outer layers, such as for example by "tucking" the mask material under a subsequently-laminated layer. The mask material protects the circuit etch on the flexible circuit during the etching of the outer conductive layers.

There are drawbacks with the use of such masking techniques. From a reliability viewpoint, it is difficult to obtain a good seal between the mask material and the subsequently-applied outer insulating layers at the periphery of the window areas. Thus it is possible that etchant or other contaminants are introduced into the circuit structure, causing damage and shortening the lifetime of the circuit board. From a cost viewpoint, it is undesirable to require the use of a separate masking step prior to etching the outer conductive layers, because each additional step in fabrication increases the cost and complexity of the overall process and resulting rigid/flex board.

It would be desirable to improve the manufacturing of rigid/flex circuit boards to reduce costs and complexity, while maintaining or enhancing the reliability of the fabricated circuit boards.

BRIEF SUMMARY OF THE INVENTION

A rigid/flex circuit board and fabricating process are disclosed that avoid the complex and costly steps of masking a flexible inner circuit in preparation for etching of a copper foil on a rigid outer circuit structure. As a result, the cost effectiveness of the rigid/flex circuit board is improved.

In the disclosed process, patterns of electrical traces are formed by etching conductive layers formed on outer surfaces of a flexible multi-layer circuit structure. The etched traces are then protected by depositing a protective barrier material that is resistant to a subsequently-used copper etching solution. Examples of such a material include tin and combinations of tin and oxides, which are resistant to ammonia-based copper etching solutions. The protective barrier material is deposited using an "electroless" process, such as immersion of the flexible circuit board in an aqueous solution containing ionic tin. The protective barrier material adheres to the copper traces to encapsulate them for subsequent processing.

Outer circuit structures are then laminated onto the flexible circuit structure. In one embodiment, the outer structure includes a bondfilm of epoxy-impregnated fiberglass ("prepreg" bondfilm) and a copper foil layer. The prepreg bondfilm has a window area removed by routing or an equivalent process prior to being laminated to the flexible structure. The window area defines a flex area of the rigid/flex circuit board that will be relatively flexible, enabling the rigid/flex circuit board to be folded, twisted, or otherwise shaped as necessary for a given enclosure or mounting scheme.

During the outerlayer etching process, the portion of the outer copper foil above the window area of the prepreg bondfilm is then removed, using a chemical etchant to which the previously-applied protective barrier material is immune. After the copper foil is etched, the protective barrier material in the flex area of the flexible circuit is stripped away. A flexible sealing coating is then applied to the circuit board. The sealing coating covers the edges of the outer laminated circuit structure adjacent to the flex area to seal the circuit structures against moisture and other contaminants.

The disclosed fabricating method has several benefits. The protective barrier material on the copper traces of the flexible circuit acts as an etch stop in the flex area to protect the traces during the etching of the rigid circuit structure. There is no need for a separate solder mask or cover coat process to be performed on the inner layer. The outer coating seals the edges of the outer circuit structure adjacent to the flexible area, and makes for a continuous coating of relatively uniform thickness across the circuit board. Also, there is no need for a mechanical process of removing the "pouch" formed by the copper foil extending over the flex area of the flexible circuit.

Other aspects, features, and advantages of the present invention are disclosed in the detailed description which follows.

BRIEF DESCRIPTION OF THE SEVERAL VIEWS OF THE DRAWING

FIG. 1 is a flow diagram of a process for fabricating a flexible inner circuit structure according to the present invention;

FIG. 2 is a schematic edge view of the flexible inner circuit structure resulting from the process of FIG. 1;

FIG. 3 is a schematic edge view of the flexible inner circuit structure of FIG. 2 and additional outer circuit layers to be laminated thereto to create an intermediate workpiece;

DETAILED DESCRIPTION OF THE INVENTION

Figure 4:
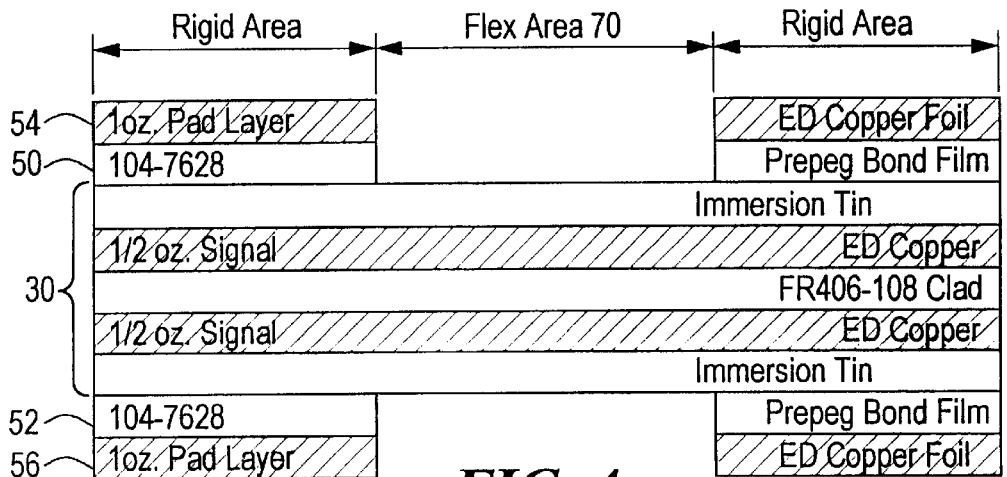
FIG. 4 is a schematic edge view of a workpiece resulting from lamination according to FIG. 3 and subsequent removal of a portion of outer copper foil to expose a flex area of the flexible inner circuit structure.

The disclosure of U.S. Provisional Patent Application No. 60/088,282 filed Jun. 5, 1998 entitled "Rigid/Flex Printed Circuit Board" is hereby incorporated by reference.

FIG. 1 shows a process by which a flexible inner circuit structure or "innerlayer" for use in a rigid/flex circuit board is made. In step 10, tooling holes are punched into a copper-clad flexible substrate, such as a glass-reinforced epoxy or polyimide "prepreg" material commonly known as "thin-core FR4". The flexible substrate may also be an adhesive-based or adhesive-less polyimide film. In step 12, photoresist material is applied to the copper cladding on both sides of the substrate in respective patterns reflecting a set of circuit interconnections to be made by the flexible substrate. These patterns are exposed to ultraviolet light in step 14 and developed in step 16. In step 18, the copper that is not covered by exposed photoresist is etched using a suitable chemical etchant such as an ammoniacal etching solution. In step 20 the photoresist is stripped away. The resulting set of copper interconnection traces is then inspected at step 22. At step 24, the copper traces are covered with a protective barrier material, in preparation for subsequent processing of the flexible substrate into a rigid/flex circuit board as described below. In the illustrated embodiment, the barrier material is tin, and it is deposited by immersing the circuit structure in a solution containing ionic tin.

An edge view of the innerlayer resulting from the process of FIG. 1 is shown in FIG. 2. The innerlayer 30 consists of the FR4 core 32, copper signal layers 34 and 36, and immersion tin layers 38 and 40. The layers 34, 36, 38 and 40 are shown as solid and smooth in the schematic view of FIG. 2; however, in actuality these layers exhibit contouring due to the selective etching that defines individual circuit traces in the layers 34 and 36. Also, the immersion tin in the layers 38 and 40 adheres to and encapsulates the copper areas in layers 34 and 36, leaving areas of the core 32 exposed where copper from the layers 34 and 36 has been etched away.

In alternative embodiments the protective barrier layers 38 and 40 may employ materials other than tin, such as for example gold. The protective barrier material should adequately encapsulate the copper traces in layers 34 and 36, and it should be resistant to a chemical copper etchant used in a subsequent processing step as described below. Also, the material should provide a surface to which a subsequently-applied bondfilm can adequately bond, as described below.

FIG. 3 is an exploded view illustrating the next step in the rigid/flex fabrication process. Layers 50 and 52 of prepreg bondfilm are laminated onto the outer surfaces of the innerlayer 30, and copper foil layers 54 and 56 are applied to the outer surfaces of bondfilm layers 50 and 52. Although in general the bondfilms 50 and 52 and foil layers 54 and 56 are also flexible, the overall structure resulting from laminating these additional layers is significantly more rigid than the innerlayer 30 alone. Prior to being laminated to the innerlayer 30, the prepreg bondfilm layers 50 and 52 have respective window areas 58, 60 removed by routing or an equivalent process. As described in greater detail below, the window areas 58 and 60 define an area of the resulting rigid/flex circuit board having relatively greater flexibility. This area is thus referred to as the "flex" area of the rigid/flex circuit board. It will also be appreciated that after lamination of the bondfilm layers 50, 52 and the copper layers 54 and 56, the material surrounding the window areas 58 and 60 forms respective "pouches". These pouches are subsequently removed as described below.

In alternative embodiments the bondfilm layers 50 and 52 may be formed of different materials. For example, a bondfilm employing a 1-mil layer of polyimide and 1-mil outer layers of acrylic adhesive may be used. A bondfilm of this type is available from DuPont company and known by the trade name KAPTON LFO 111.

The next step in the process is the selective etching of the outer copper layers 54 and 56 in a manner similar to that shown in FIG. 1 for the inner copper layers 34 and 36 (FIG. 2). However, the circuit patterns on the outer copper layers 54 and 56 are such that the entire area adjacent to the window areas 58 and 60 (FIG. 3) is removed, forming a flex area 70 of the rigid/flex board as shown in FIG. 4. The copper foil is removed using a chemical etchant to which the immersion tin of the innerlayer 30 is immune, such as for example an ammonia-based etchant. The use of such an etchant allows for the removal of the copper in the layers 54 and 56 without affecting the integrity of the traces in the layers 34 and 36 (FIG. 2).

Figure 5:
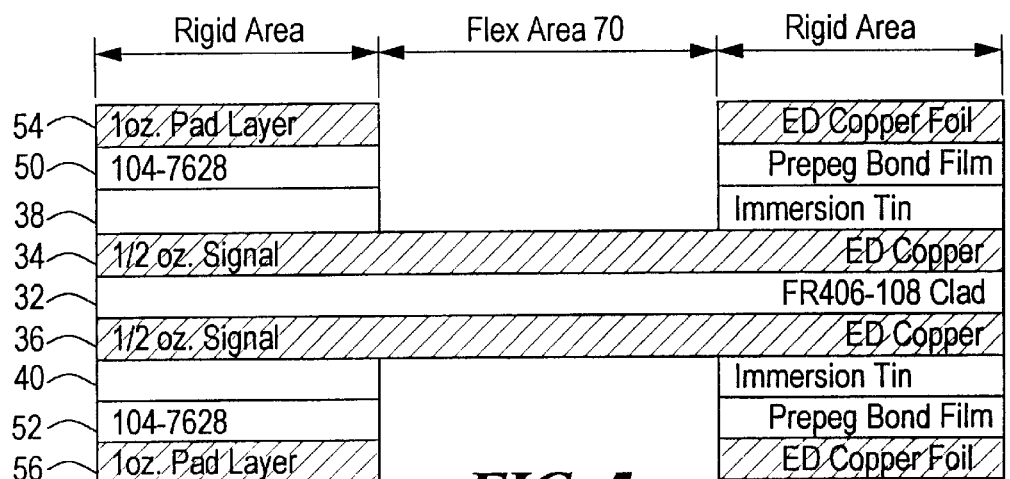
FIG. 5 is a schematic edge view of the workpiece of FIG. 4 after having an immersion tin layer stripped away from the flex area of the flexible inner circuit structure.

As shown in FIG. 5, the next step is the removal of the portions of the immersion tin layers 38, 40 in the flex area 70. This stripping of the immersion tin can be accomplished using known means, such as for example a 2-part tin/lead stripping process used by many printed circuit manufacturers. 1-part stripping processes can also be employed.

Figure 6:
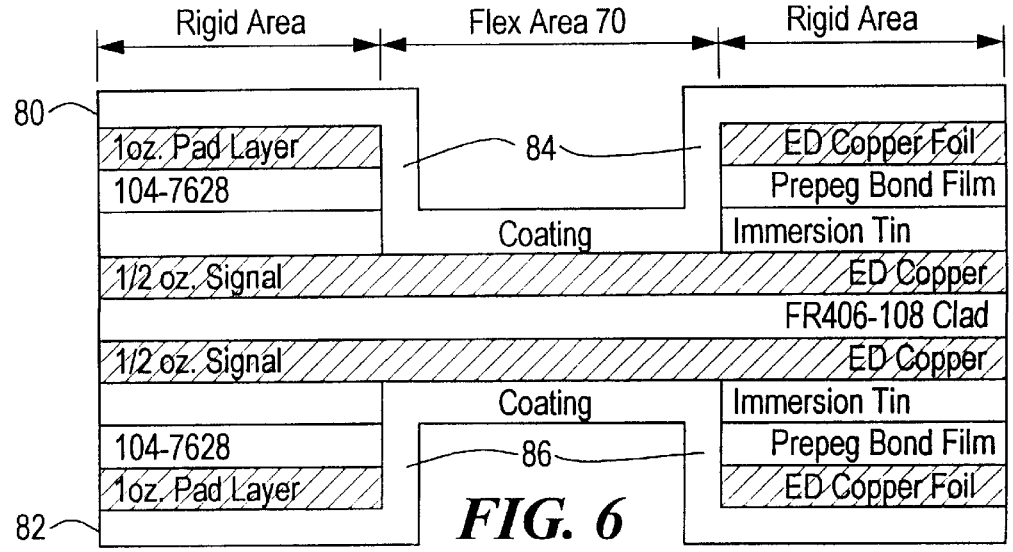
FIG. 6 is a schematic edge view of the workpiece of FIG. 5 after having a sealing coating deposited thereon.

FIG. 6 illustrates that the next step is the deposition of flexible solder mask layers 80 and 82 onto the rigid/flex circuit board. The layers 80 and 82 uniformly and continuously coat the circuit board across the flex area 70 and the rigid circuit areas. In particular, the edge areas 84 and 86 adjacent to the flexible area 70 are sealingly coated to prevent the introduction of moisture or other contaminants into the laminated structure. In one technique, the material used for the layers 80 and 82 is an epoxy-based material known by the trade name PALCOAT® that is sprayed onto the outer surfaces of the rigid/flex circuit board. In another technique, a photo-imagable coverlay known by the DuPont tradename PIC™ is used.

Although in the illustrated embodiment the protective barrier layers 38 and 40 are homogeneous layers of tin, in alternative embodiments these layers may include a protective material such as tin in the flex area 70 and another material or materials in the rigid area. For example, it may be desirable to use an oxide material such as a tin oxide in the rigid area.

A rigid/flex circuit board and a method of fabricating such a circuit board have been described. It will be apparent to those skilled in the art that modification to and variation of the above-described methods and apparatus are possible without departing from the inventive concepts disclosed herein. Accordingly, the invention should be viewed as limited solely by the scope and spirit of the appended claims.

What is claimed is:

1. A method of fabricating a rigid/flex printed circuit board, comprising the steps of:

depositing a protective barrier material on copper circuit traces appearing on a surface of a flexible first circuit structure, the protective barrier material being resistant to a copper-etchant solution to be used in a subsequent step of the fabricating method;

laminating at least a second circuit structure to the surface of the first circuit structure after the protective barrier material has been deposited, the second circuit structure including an insulating layer having a window area opening and an outer copper foil a portion of which covers the window area opening;

etching the outer copper foil using the copper-etchant solution, the etching being effective to remove the portion of the outer copper foil covering the window area opening of the insulating layer and to thereby expose a flex area of the first circuit structure;

stripping the protective barrier material from the copper circuit traces in the flex area of the first circuit structure exposed by the etching step; and depositing a sealing coating onto the laminated structure formed by the foregoing steps such that the flex area of the first circuit structure and the adjacent edges of the second circuit structure are sealed against moisture and contaminants.

2. A method according to claim 1, wherein the step of depositing a protective barrier material comprises the step of immersing the first circuit structure into an aqueous solution containing the protective barrier material in ionic form.

3. A method according to claim 1, wherein the protective barrier material is tin.

4. A method according to claim 1, wherein the second circuit structure comprises a glass-reinforced bondfilm as the insulating layer.

5. A method according to claim 1, wherein the copper-etchant solution is an ammoniacal etching solution.

6. A method according to claim 1, wherein the step of depositing a sealing coating comprises spraying an epoxy material onto the rigid/flex board.

7. A rigid/flex printed circuit board, comprising:

a flexible innerlayer having an insulating layer and a conductive layer including conductive circuit traces, the innerlayer extending across both a relatively rigid section of the printed circuit board and a relatively flexible section of the printed circuit board, the conductive circuit traces in the rigid section of the printed circuit board being covered with a protective barrier material and the conductive circuit traces in the flexible section of the printed circuit board being free of the protective barrier material;

at least one outerlayer laminated to the innerlayer in the rigid section of the printed circuit board, the outerlayer including an insulating layer adhering to the covered circuit traces on the innerlayer and a conductive layer adhering to the insulating layer; and a sealing coating disposed over the rigid and flexible sections, the sealing coating being effective to seal the boundary between the flexible and rigid sections of the printed circuit board against moisture and contaminants.

8. A printed circuit board according to claim 7, wherein the protective barrier material is tin.

9. A printed circuit board according to claim 7, wherein the outerlayer comprises a glass-reinforced bondfilm as the insulating layer.

10. A printed circuit board according to claim 7, wherein the coating comprises an epoxy material.

* * * * *

UNITED STATES PATENT AND TRADEMARK OFFICE
CERTIFICATE OF CORRECTION

PATENT NO. : 6,099,745
DATED : August 8, 2000
INVENTOR(S) : Darryl McKenney et al.

It is certified that error appears in the above-identified patent and that said Letters Patent is hereby corrected as shown below:

<u>Column 1,</u>
Line 28, "rigid/flex having", should read -- rigid/flex board having --.

Signed and Sealed this

Eleventh Day of December, 2001

*Attest:*

NICHOLAS P. GODICI
*Attesting Officer*     Acting Director of the United States Patent and Trademark Office